(12) United States Patent
Ota

(10) Patent No.: US 7,245,211 B2
(45) Date of Patent: Jul. 17, 2007

(54) ELECTRONIC TAG, SYSTEM AND METHOD FOR SELECTING COMPONENT

(75) Inventor: Motoari Ota, Asaka (JP)

(73) Assignee: Fujifilm Corporation, Tokyo (JP)

( * ) Notice: Subject to any disclaimer, the term of this patent is extended or adjusted under 35 U.S.C. 154(b) by 133 days.

(21) Appl. No.: 11/055,520

(22) Filed: Feb. 11, 2005

(65) Prior Publication Data
US 2005/0179549 A1 Aug. 18, 2005

(30) Foreign Application Priority Data
Feb. 12, 2004 (JP) ............................. 2004-035288

(51) Int. Cl.
*G08B 26/00* (2006.01)
(52) U.S. Cl. .............. 340/505; 340/539.1; 340/539.11; 340/572.1
(58) Field of Classification Search ................ 340/505, 340/539.1, 539.11, 572.1
See application file for complete search history.

(56) References Cited

U.S. PATENT DOCUMENTS 5,959,568 A * 9/1999 Woolley ...................... 342/42
6,496,806 B1 * 12/2002 Horwitz et al. ............... 705/28
7,023,356 B2 * 4/2006 Burkhardt et al. ..... 340/825.49
7,113,099 B2 * 9/2006 Tyroler et al. ........... 340/573.4

FOREIGN PATENT DOCUMENTS

JP 2002-49900 A 2/2002

* cited by examiner

*Primary Examiner*—Daryl C Pope
(74) *Attorney, Agent, or Firm*—Sughrue Mion, PLLC

(57) ABSTRACT

According to the present invention, the component selection information sent out from the signal transmitter to the electronic tag attached to the component is collated in the electronic tag with the component identification information recorded in the electronic tag, so that the notifying device notifies the collation result, as a result of which the selected component can be easily recognized by the notification. Additionally, according to the present invention, a write signal is sent out from the signal transmitter to the electronic tag. When the electronic tag receives the write signal, the component identification information is written in the electronic tag. Therefore, it is possible to write the component identification information in the electronic tag in a state in which the electronic tag is attached to the component.

24 Claims, 9 Drawing Sheets

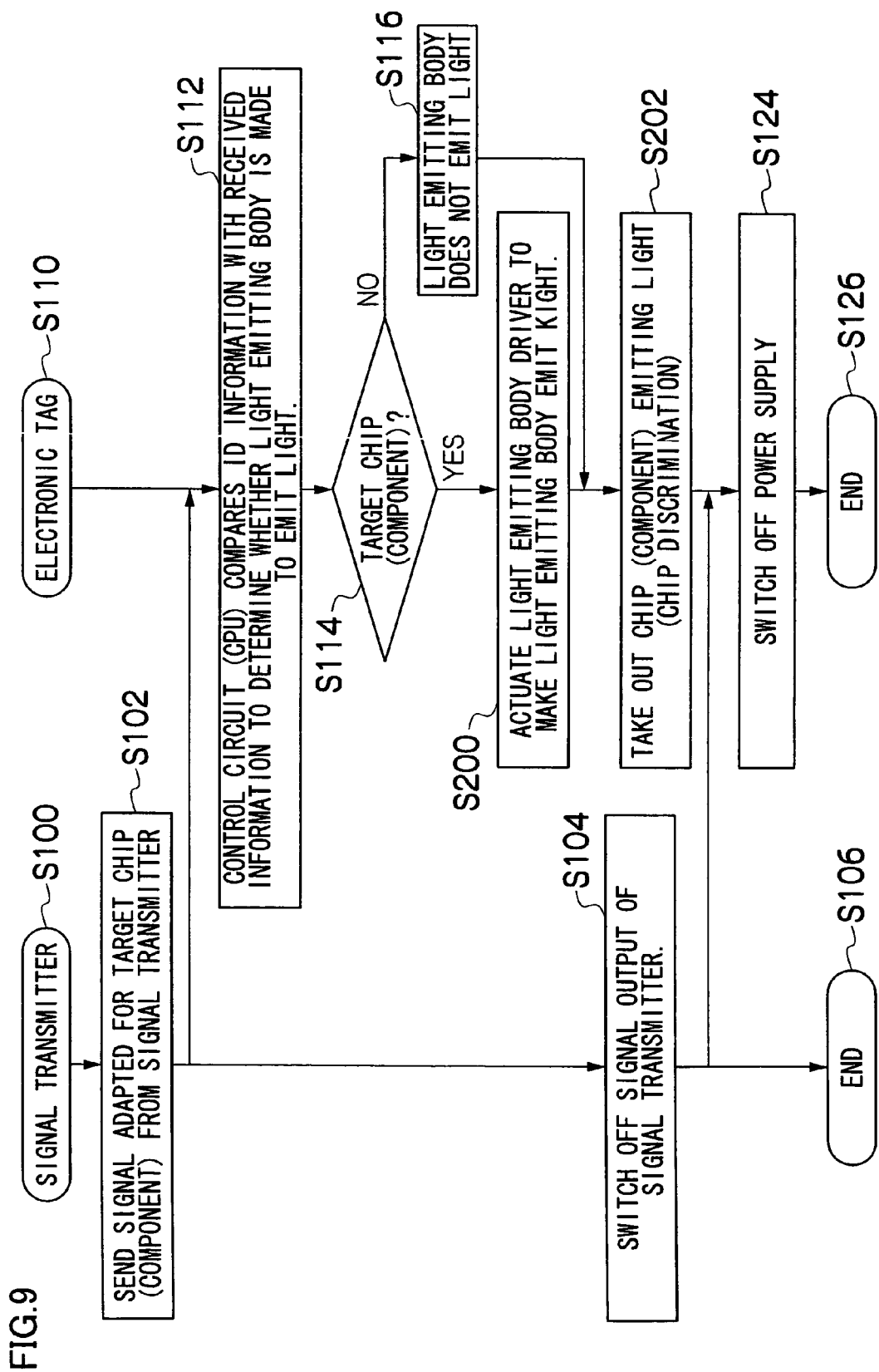

ELECTRONIC TAG, SYSTEM AND METHOD FOR SELECTING COMPONENT

BACKGROUND OF THE INVENTION

1. Field of the Invention

The present invention relates to an electronic tag and a system and method for selecting component, and more particularly to a component selection technique for selecting a desired component from a mixture of various components by using an electronic tag.

2. Related Art

In recent years, an article management system in which electronic tags are used for article management of articles and components, etc. has been widespread. In the system, an electronic tag, in which management information of an article to be controlled is recorded, is attached to (incorporated in) the article. When the electronic tag receives an electromagnetic wave outputted from a reader which is an information reader for reading information provided for the electronic tag, the electronic tag is excited by the electromagnetic wave so as to output an electromagnetic wave including the recorded management information.

When the leader receives the electromagnetic wave outputted from the electronic tag, the electromagnetic wave is converted into the management information in the leader, so as to enable a display device, such as a display which is provided for the leader, to display the management information. Since the electromagnetic wave sent out from the reader is capable of exciting a plurality of electronic tags, while the reader is capable of receiving a plurality of electromagnetic waves (management information) sent out from the electronic tags almost simultaneously, it is possible to obtain a plurality of pieces of management information in a short period of time.

For example, an accounting system has been realized, wherein an electronic tag in which information, such as a price and a consumption limit date is recorded, is attached to an article of merchandise in a supermarket, and wherein when the plurality of articles collected in a shopping basket etc. pass in front of a reader, the reader reads prices of all the articles in the basket for calculating the total amount. In addition, in the case where an article of food of which consumption period expired is included in the basket, the reader is also capable of detecting the article, so as to notify the information by displaying the information on a display device or the like.

At present, the electronic tag is made minute so as to be manufactured by a printing process used for a production process of surface mount devices (SMDs), and a wiring process of a printed circuit board and ICs, so that the electronic tag can be manufactured to be small and thin, and can also be incorporated in the SMDs and ICs.

In a system and method for managing articles, which is disclosed in Japanese Patent Application Laid-open No. 2002-49900, and in which an electronic tag is utilized, the electronic tag with specific management information recorded therein is configured to be attached to an article, so that a reader/writer terminal can read out the specific information so as to display it on a display device.

SUMMARY OF THE INVENTION

However, the article management system and the supermarket accounting system, which are described above, require a receiver (reader) for receiving an electromagnetic wave which is a piece of article information and which is sent out from an electronic tag, and for restoring the piece of article information from the received electromagnetic wave. Further, in order to enable the article information to be viewed, a method in which the reader is provided with a display device such as a display, or a method in which the reader is connected with a display device so as to make the display device display the information, or the like, are needed so that the article information can be browsed.

Although in the system and method for managing articles, which is disclosed in Japanese Patent Application Laid-open No. 2002-49900, and in which an electronic tag is utilized, a position and method for attaching the electronic tag are specifically disclosed, the article information is displayed on a display of a reader/writer terminal as in the conventional way in order for a user to browse the article information stored in the electronic tag, as a result of which the reader/writer terminal (receiver) with a display device, such as a display needs to be provided.

The present invention has been made in view of the above described circumstances. An object of the present invention is to provide an electronic tag and a system and method for selecting component, which are simply constructed, and which are capable of managing articles highly reliably and efficiently.

In order to achieve the above described object, according to a first aspect of the present invention, there is provided an electronic tag capable of being attached to a component, comprising: a recording device which records component identification information of a component to which the electronic tag is attached; a receiving device which receives a component selection signal containing component selection information sent out from a signal transmitter by using an electromagnetic wave; a collating device for collating the component selection information contained in the component selection signal acquired by the receiving device with the component identification information recorded in the recording device; and a notifying device which notifies the result of collation performed by the collating device.

That is, an electronic tag is attached to a component, and in the tag, component identification information of the component is recorded. When the electromagnetic receives a component selection signal sent out from a signal transmitter, collation of component selection information contained in the received component selection signal with the component identification information recorded in the electronic tag is performed, and the collation result is notified by the notifying device, as a result of which a necessary component can be easily taken out from a mixture of various components, depending upon the information notified by the notifying device provided for the electronic tag.

Since the notifying device provided for the electronic tag is operated so as to notify the collation result, it is not necessary to transmit information of the collation result to the signal transmitter. Accordingly, the electronic tag need not be provided with an information transmission device. When the information transmission to the signal transmitter is not performed, the signal transmitter need not be provided with a receiving device which receives the information sent out from the electronic tag.

The electronic tag has various names, such as RFID (Radio Frequency Identification System), wireless tag, non-contact tag and μ-Chip (trademark). The electronic tag has a basic construction comprising: a recording device (memory) which stores data (information); a communication device for radio communication (RF circuit); a logic circuit which connects these devices; and a microcomputer which performs control of each device.

The electronic tag is provided with a function to receive an electromagnetic wave sent out from a signal transmitter so as to generate electric power by electromagnetic induction, so that the interior of the electronic tag can be operated by the electric power.

The electronic tag includes those which has an outline dimension of about 1 mm square, and which is built in a medium such as an IC card, etc. to form a layer of a laminated structure.

The electromagnetic wave includes radio waves, such as AM wave, FM wave, digital wave, analog wave and light, by way of which the signal transmission is performed, and by way of which radio communication, etc. may also be performed.

The component identification information may include at least one of pieces of information including the name, the type, the date of manufacture, the production number and the lot number, etc. of a component. The component identification information may comprise one piece of information, or may comprise a plurality of pieces of information.

In the present invention, the component may include not only electronic components, such as a resistor and an IC, etc. and mechanical components, such as a thread and a nut, etc., but also a mechanism member constituting a mechanical system. The invention can also be applied to a general article.

However, a chip component referred to as SMD (Surface Mount Device) is extremely small-sized among electronic components, which makes it difficult to display component information on the chip surface. Accordingly, attaching to the SMD the electronic tag in which the component information is recorded, makes it possible to conveniently obtain various component information which cannot be displayed on the component surface.

In electronic components, in addition to a mode in which an electronic tag is attached to the component surface section, a mode in which an electronic tag is incorporated in a chip may also be applied.

The notifying device may include a mode for performing notification using vision or sensation for light, sound, heat and color, etc., and a mode in which a corresponding object is made to be physically moved by magnetic and electrostatic force, etc.

A second aspect of the present invention is characterized in that the notifying device in the first aspect comprises a magnetizing device which is magnetized in the case where as a result of collation performed by the collating device, the component selection information is determined to coincide with the component identification information.

That is, when a metal (magnetic material) is brought closer, a desired component is made to attach to the metal etc., so that a desired component can be taken out selectively.

The magnetizing device includes a mode in which a coil is fed with an exciting current so as to form the coil as an electromagnet. A mode in which a magnetic body such as a silicon steel plate is provided in the coil is preferred.

A third aspect of the present invention is also characterized in that the notifying device in the first aspect comprises a light emitting device which is made to emit light when as a result of collation performed by the collating device, the component selection information is determined to coincide with the component identification information.

That is, a desired component can be made to emit light selectively, so as to facilitate visual discrimination of the component to be selected.

It is preferred to use a chip LED as a light emitting body. Of course, other light emitting bodies may be used.

A selected component taking-out device which automatically takes out a selected component indicated by the light emitting body may be provided.

According to a fourth aspect of the present invention, there is also provided, in the first to third aspects, a component identification information writing device for writing component identification information in the recording device, when receiving a write signal containing the component identification information of a component to which the electronic tag is attached.

That is, the component identification information recorded in the electronic tag can be written in after the electronic tag is attached to the component. In addition, the component identification information of the electronic tag in which the component identification information has been written, may be arranged to be rewritable.

In order to achieve the above described object, according to a fifth aspect of the present invention, there is also provided a component provided with the electronic tag described in any one of the first to fourth aspect.

That is, various components (articles) can be selected by attaching the electronic tag described above. The electronic tag may be attached (incorporated) during the production process of a component, or subsequently to the production process, may be attached during the inspection process and the mounting process.

As described above, in the present invention, the component may include not only electronic components, such as a resistor and an IC, etc. and mechanical components, such as a thread and a nut, etc., but also a mechanism member constituting a mechanical system. The invention can also be applied to a general article.

In order to achieve the above described object, according to a sixth aspect of the present invention, there is provided a component selection system comprising: an electronic tag attached to a component; and a signal transmitter which sends out an electromagnetic wave to the electronic tag, wherein the signal transmitter comprises the signal transmission device which sends out a component selection signal containing component selection information for selecting a component to which the electronic tag is attached, and wherein the electronic tag comprises: a receiving device which receives the component selection signal sent out from the signal transmitter; a recording device which records component identification information of a component to which the electronic tag is attached; a collating device which collates the component selection information contained in the radio signal received by the receiving device with the component identification information recorded in the recording device; and a notifying device which notifies the result of collation performed by the collating device.

For example, when a component selection signal of a desired component is sent out from the signal transmitter to a pallet on which a number of (various kinds of) components are present in a mixed state, a desired component is notified by the notifying device provided for the electronic tag in which the component information coincident with the component selection information contained in the component selection signal is recorded.

According to a seventh aspect of the present invention, there is also provided, in the sixth aspect, a component taking-out device which selectively takes out a desired component from a mixture of a number of components based on the notification result given by the notifying device.

That is, since the desired selected component, which is notified by the notifying device, is arranged to be automatically taken out, the desired component can be selectively taken out from the place where a number of components are present in a mixed state on a pallet or a tray.

The component taking-out device includes a robot, in which a light emitting body is used as the notifying device, and which is capable of automatically recognizing and taking out the component indicated by the light emitting body, and a mode, in which a magnetizing device such as a coil is used as the notifying device, and in which a metal, etc. is brought closer so as to attract (attach to) a component (electronic tag) magnetized by the magnetizing device, to selectively take out the component, and the like.

An eighth aspect of the present invention is characterized in that the signal transmitter, in the sixth to seventh aspects, comprises a component identification information storing device which stores component identification information to be written in the electronic tag, and sends out to the electronic tag a write signal containing a piece of component identification information selected from the component identification information stored in the component identification information storing device.

That is, the component identification information of a component to which the electronic tag is attached can be sent out to the electronic tag using non-contact signal transmission from the signal transmitter. That is, the signal transmitter has a function of sending out information to the electronic tag, and can be operated as a writing device of the component identification information.

A ninth aspect of the present invention is characterized in that the electronic tag, in the eighth aspect, comprises a component identification information writing device which acquires the write signal sent out from the signal transmitter, and writes in the recording device the component identification information contained in the write signal.

That is, since it is configured that the write signal sent out from the signal transmission device is acquired, and the component identification information contained in the write signal is written in the recording device, the component identification information can be written in the electronic tag in which the component identification information is not written.

In the electronic tag in which the component identification information is recorded, it is also possible to rewrite the component identification information. When rewriting the component identification information, a mode comprising a device which erase the written component identification information is preferred.

A tenth aspect of the present invention is characterized in that the component to which the electronic tag is attached, in any one of the sixth to ninth aspects, includes an electronic chip component.

A mode of attaching the electronic tag to the component may be configured such that the electronic tag is attached on the surface of the component or incorporated in the component.

In order to achieve the above described object, according to a eleventh aspect of the present invention, there is provided a component selection method of the component selection system comprising an electronic tag attached to a component and a signal transmitter having a signal transmission device which sends out an electromagnetic wave to the electronic tag, wherein when an electromagnetic wave containing component selection information for selecting a component to which the electronic tag is attached, is sent out by the signal transmission device provided for the signal transmitter, the electronic tag receives the radio signal sent out from the signal transmitter, and collates the component selection information contained in the received radio signal with the component identification information recorded in the recording device provided for the electronic tag, so as to notify the collation result.

According to the present invention, the component selection information sent out from the signal transmitter to the electronic tag attached to the component is collated in the electronic tag with the component identification information recorded in the electronic tag, so that the notifying device notifies the collation result, as a result of which the selected component can be easily recognized by the notification.

The notifying device includes a mode for magnetizing the electronic tag using the magnetizing device, and a mode for making the light emitting body emit light. A mode provided with the component taking-out device for selectively taking out the component notified by the notifying device is preferred.

A write signal is sent out from the signal transmitter to the electronic tag. When the electronic tag receives the write signal, the component identification information is written in the electronic tag. Therefore, it is possible to write the component identification information in the electronic tag in a state in which the electronic tag is attached to the component.

BRIEF DESCRIPTION OF THE DRAWINGS

FIG. 9 is a flow chart showing a flow of control of the component management system according to the modification.

DETAILED DESCRIPTION OF THE PREFERRED EMBODIMENTS

Preferred embodiments of an electronic tag and of a system and method for selecting component according to the present invention will be described hereinbelow with reference to accompanying drawings.

Figure 1:
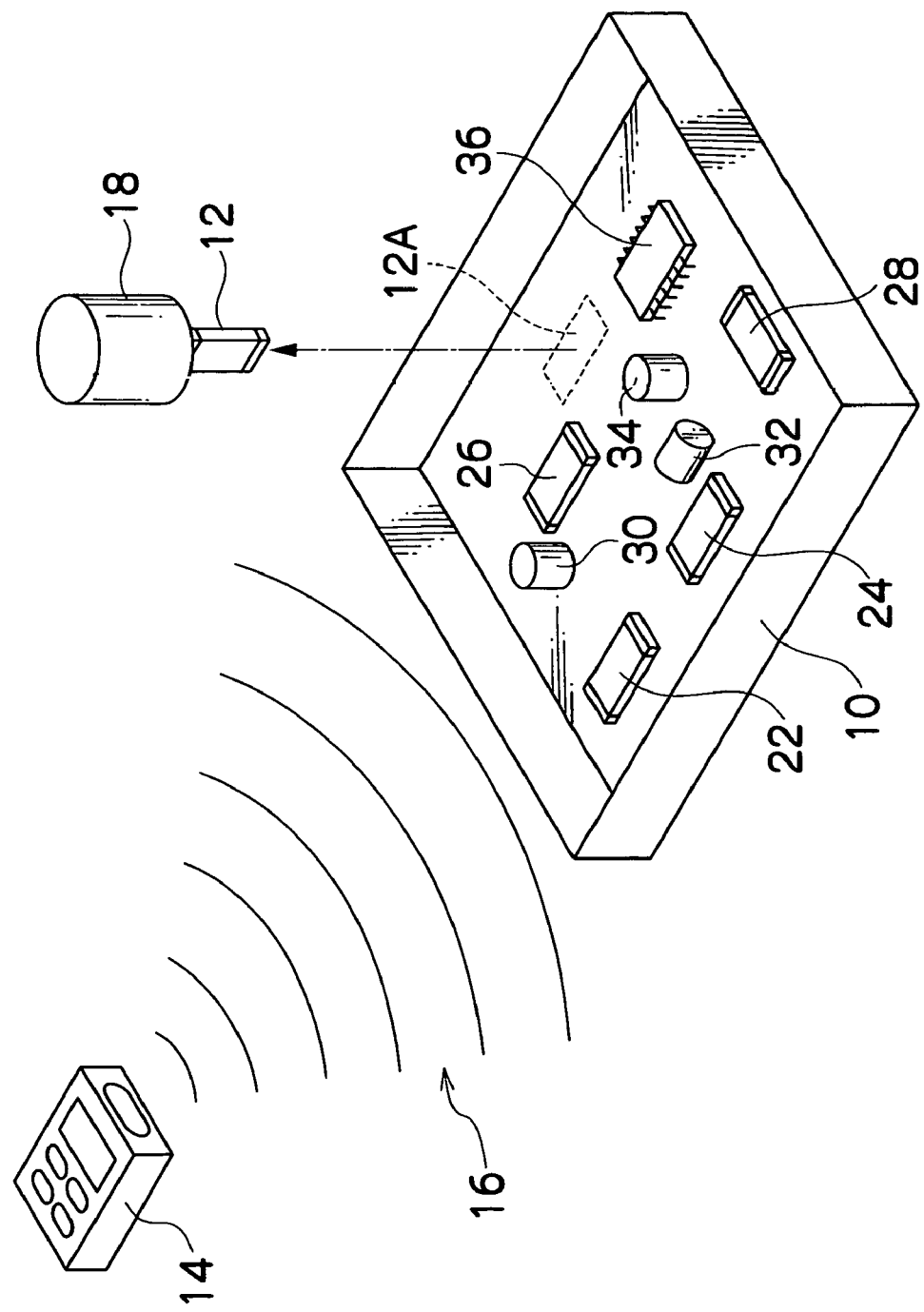
FIG. 1 is a figure showing a configuration of a component management system according to an embodiment of the present invention.

FIG. 1 is a figure showing an outline of a component management system according to an embodiment of the present invention. The component management system shown in FIG. 1 selects and takes out a desired component 12 from various components contained in a part case 10.

In the part case 10, various kinds of electronic chip components (SMDs) are contained and electronic tags (not shown in FIG. 1 and shown by reference numerals 40, 42, 44, etc. in FIGS. 2A to 2C) are attached to the chip components.

Information serving as the ID of the component is written in the electronic tag. In the information, the component management information including the name, the type, the production number, the date of manufacture, the lot number and the manufacturer, etc. of the component is recorded. The above described component management information is only an example, and at least one piece of the information described above may be included, or in addition to the information, the information about the external shape and the size may also be included.

When a selection signal 16 (electromagnetic wave) containing selection information (information, such as a 50 ohms resistor and a 100 pF ceramic capacitor) of a desired component is sent out from a signal transmitter (reader/writer) 14, an electronic tag provided for each component receives the selection signal 16 sent out from the signal transmitter 14. A power source is generated in the electronic tag by electromagnetic induction from the selection signal 16, and each electronic tag starts operating.

The electromagnetic wave as described above is included in a mode for performing non-contact data communication, to which various electromagnetic waves, such as FM wave, AM wave, digital wave and analog wave may be applied.

In each electronic tag, the selection information of the desired component included in the selection signal 16 is collated with the component management information recorded in each electronic tag, so that when the selection information of the component coincides with the component management information recorded in each electronic tag, an identification signal is emitted from the electronic tag.

In the present embodiments, there are shown a mode in which the electronic tag is made to be an electromagnet by the identification signal, and a mode in which the electronic tag is made to emit light by the identification signal.

For example, in the case where the desired component 12 is a 50Ω chip resistor, when a metal (magnetic body) 18 is brought closer to the part case 10 in a state in which the identification signal 16 (signal for magnetizing the electronic tag attached to the 50Ω chip resistor) is being sent out from the signal transmitter 14, the 50Ω chip resistor 12 which is present at the position denoted with 12A can be made to attach to the metal 18.

On the other hand, even when the selection signal 16 is sent out from the signal transmitter 14, an electronic tag (component) of which recorded component management information does not coincide with the component selection information, is not magnetized and does not attach to the metal 18. In this manner, the desired component can be selectively taken out from components contained in the part case 10. In addition, the metal 18, which needs only to be capable of attracting the magnetized electronic tag, can be replaced by a magnet, etc. other than a metal.

In the part case 10, chip resistors 22, 24, chip capacitors (ceramic, etc.) 26, 28, chip capacitors (electrolytic capacitor, etc.) 30, 32, 34, and chip IC 36, etc., are contained in addition to the chip resistor (50Ω) 12.

Figure 2A:
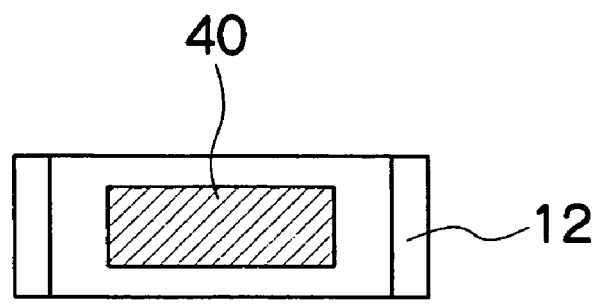
FIGS. 2A to 2C are schematic representations of the component management system shown in FIG. 1.
Figure 2B:
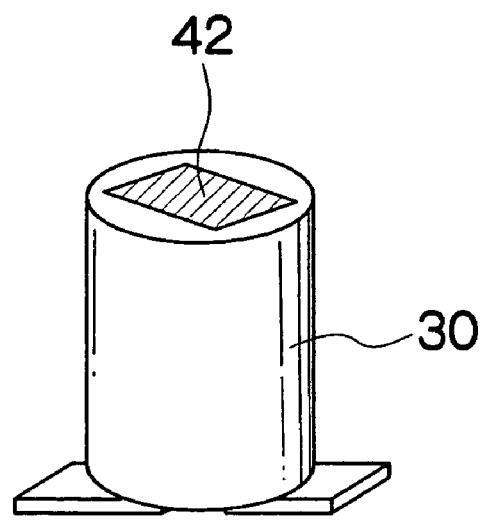
Figure 2C:
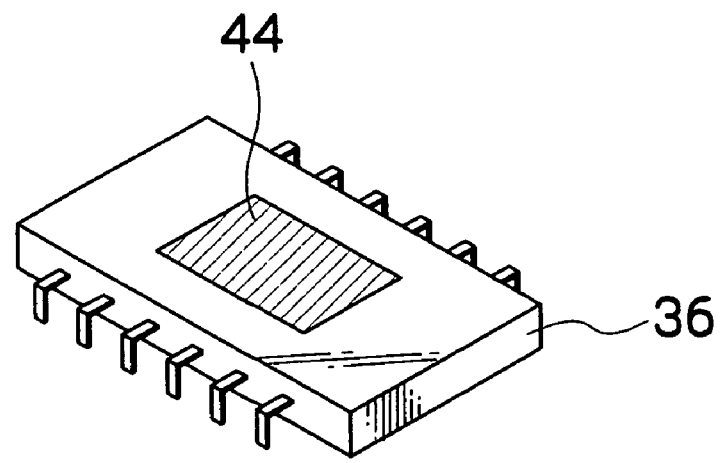

FIGS. 2A to 2C show the details of the components contained in the part case 10 shown in FIG. 1. FIG. 2A shows a chip resistor 12, and an electronic tag 40 is attached to the top surface of the chip resistor 12. Similarly, FIGS. 2B and 2C show a capacitor 30 and a chip resistor 22 respectively, and an electronic tag 42 is attached to the top surface (opposite side of the printed board attaching surface) of the chip capacitor 30, and an electronic tag 44 is also attached to the top surface (visible surface at the time of mounting on the printed board) of the chip resistor 22.

Although a mode in which an electronic tag is attached to the surface of each component is shown in the above described examples, it is also possible to incorporate an electronic tag into chip components (SMDs) or ICs.

Figure 3:
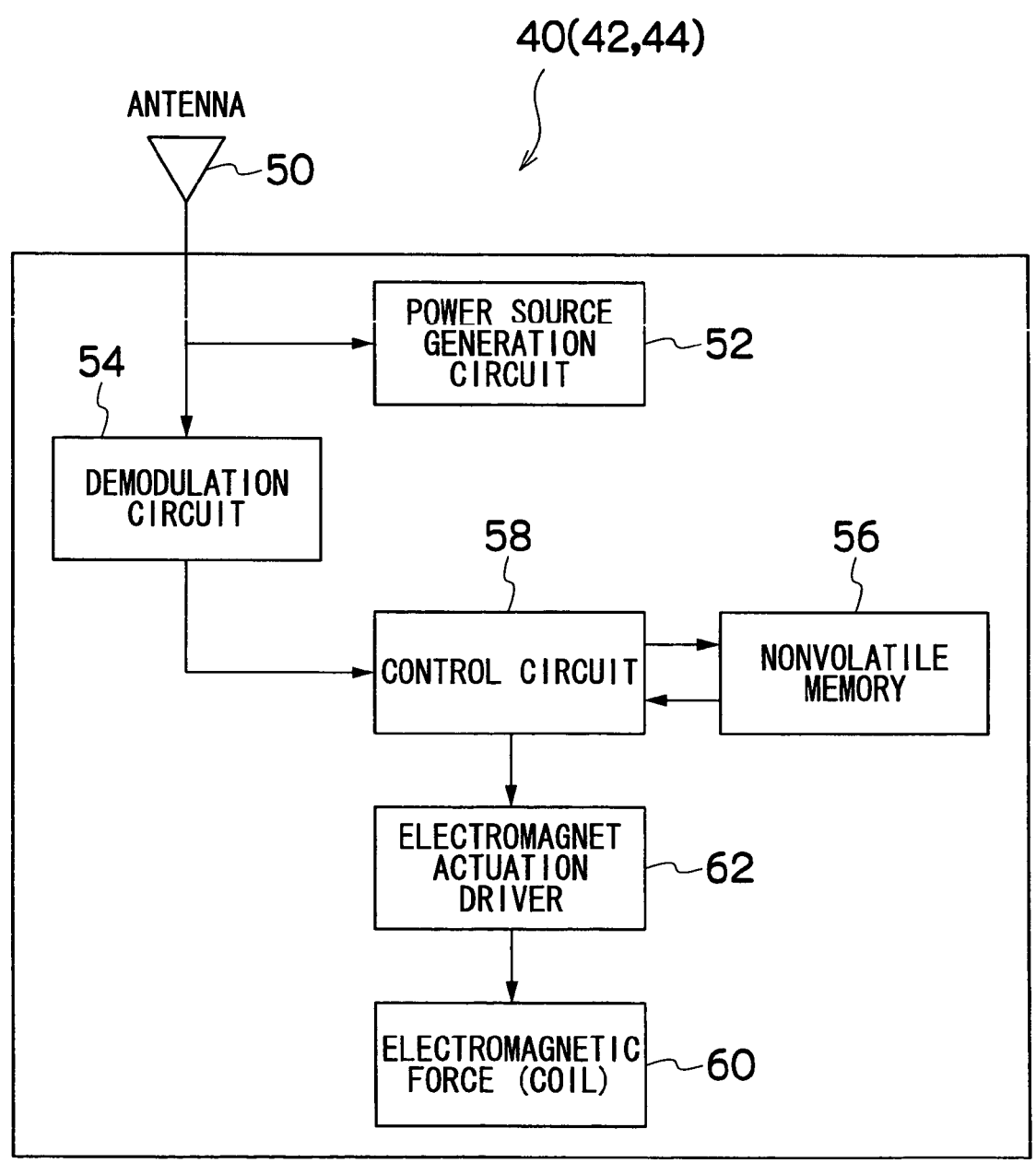
FIG. 3 is a block diagram showing an internal configuration of an electronic tag attached to a component shown in FIGS. 2A to 2C.

FIG. 3 is a block diagram showing an internal configuration of the electronic tag 40 (42, 44). The electronic tags 40, 42, 44 are of the same configuration, and the electronic tag 40 is explained as an example on behalf of these tags herein below.

The electronic tag 40 is configured to comprise: an antenna 50 which receives the selection signal 16 sent out from the signal transmitter 14 shown in FIG. 1; a power source generation circuit 52 which generates a power source to be supplied to the interior of the electronic tag 40 by electromagnetic induction from the selection signal 16 received via the antenna 50; a demodulation circuit 54 which demodulates the selection signal 16 obtained via the antenna 50; a nonvolatile memory (recording device) 56 which records the component management information; a control circuit 58 which collates the component selection information contained in the identification signal obtained from the signal transmitter 14 with the component management information recorded in the nonvolatile memory 56; and an electromagnet actuation driver 62 which performs control so as to cause electromagnetic force to be generated by supplying an exciting current to a coil 60, when the selection information is determined to coincide with the component management information as a result of collation performed by the control circuit 58.

In the nonvolatile memory 56, the component management information including the name, the type, the production number, the date of manufacture, the lot number, and the name of manufacturer, etc. of the component is recorded. An EEPROM is applied to the nonvolatile memory 56, so that the contents recorded in the nonvolatile memory 56 are retained even when the power source is disconnected. Not only the EEPROM but also EPROM and one time ROM, etc. may be applied to the nonvolatile memory 56. In addition, the nonvolatile memory 56 may comprise a plurality of devices or devices of different kinds.

Since in the initial state of the electronic tag 40 attached to a component (chip resistor 12), data (information) is not written in the nonvolatile memory 56, it is necessary to write data in each electronic tag using the signal transmitter 14. Of course, an electronic tag, of which data are written in the nonvolatile memory 56 beforehand, may also be used.

In the control circuit 58, a microprocessor (CPU) is contained and a memory (RAM), etc. which is used as a work area at the time of operation (at the time of collating) or a temporary storage area of data, may also be contained.

The coil 60 is configured such that a lead wire is spirally wound, and a core made of a ferromagnetic material, such as a silicon steel plate and a ferrite, may be provided in the center of the coil. In addition, the exciting current supplied to the coil 60 is controlled by the electromagnet actuation driver 62, and when the exciting current is supplied, the coil 60 generates electromagnetic force so as to function as a magnet, and no longer functions as an electromagnet when the exciting current is switched off.

The electromagnet actuation driver 62 controls the exciting current supplied to the coil 60, based on a command from the control circuit 58. In the case where the direction of the exciting current supplied to the coil 60 is arranged to be switched, the polarity of the magnetic force generated in the coil 60 can be changed.

Figure 4:
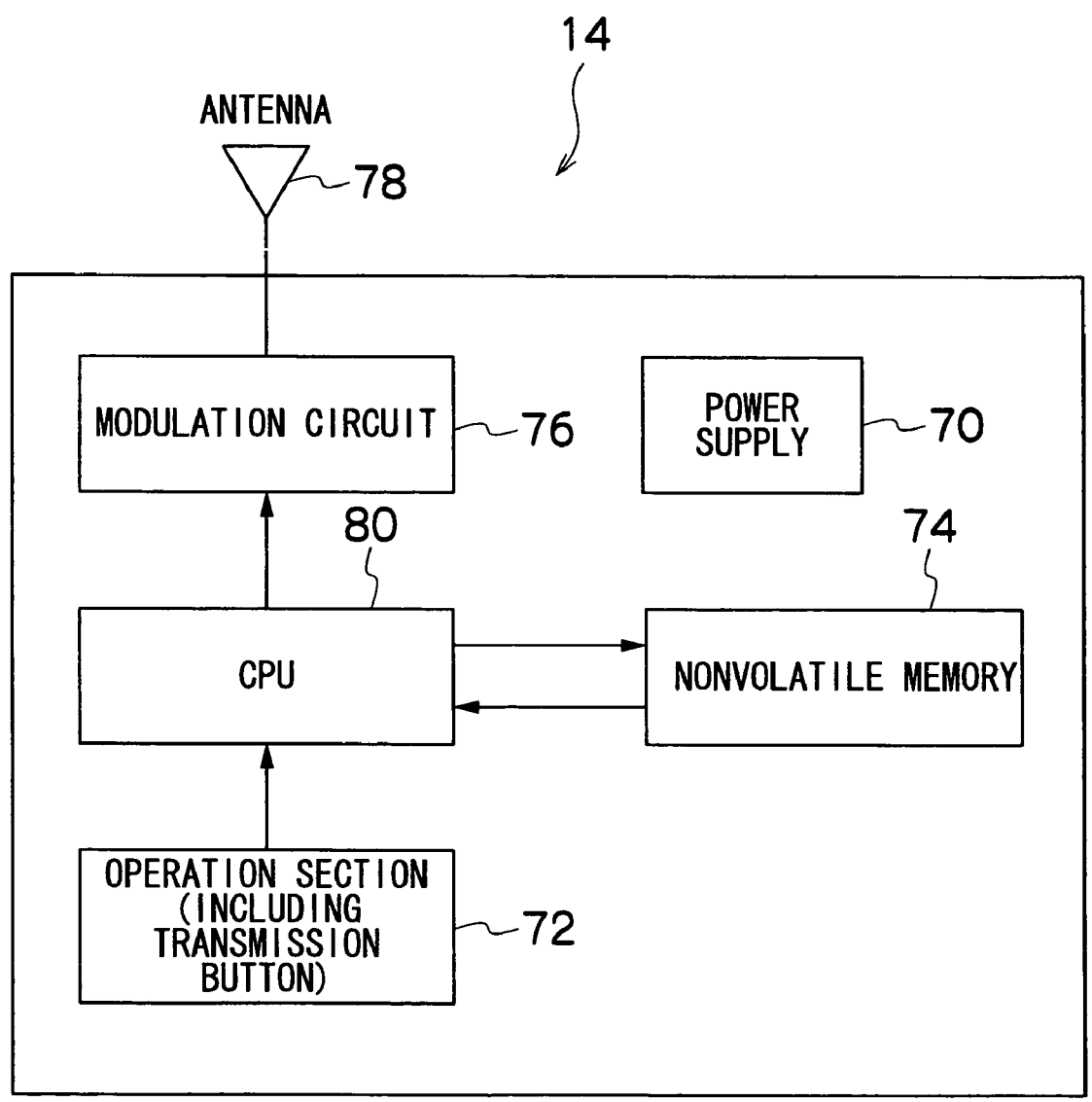
FIG. 4 is a block diagram showing an internal configuration of a signal transmitter used for the component management system shown in FIG. 1.

FIG. 4 is a block diagram showing an internal configuration of the signal transmitter 14 shown in FIG. 1.

The signal transmitter 14 has a function as a writing device (writer) for writing the component management information in each electronic tag, and a function as a transmitter for sending the identification signal to the electronic tag attached to each component.

The signal transmitter 14 is configured to comprise: a power supply 70 which is a power source in the signal transmitter 14; an operation section 72 which functions as a user interface and which contains operating members, such as a button, a switch and a lever; and a CPU 80 for performing control over reading out data stored in a nonvolatile memory 74 based on a command signal sent in response to the operation of the operation section 72, writing data in the nonvolatile memory 74, and sending out from the signal transmitter 14 to the outside the selection signal 16 containing the component selection information, via a modulation circuit 76 and an antenna 78.

As the power supply 70, a battery (cell) may be used, or a switching regulator (module) and a DC-DC converter, etc. may also be used.

A touch panel type display which can also be used as a display device may be used for the operation section 72.

The nonvolatile memory 74 is recorded with a plurality of pieces of component management information to be written in a memory of an electronic tag in the initial state of the electronic tag. The component management information includes, for example, "50Ω chip resistor, size 1608" and "100Ω chip resistor, size 1005" and the like.

A desired component is selected from the component management information, and the component management information of the selected component is made to be the component selection information contained in the selection signal 16. In addition, the component selection information may comprise one piece of information or a plurality of pieces of information.

For example, when a desired component, such as "50Ω resistor, size 1608", "100Ω resistor, size 1005", etc. is selected using the operation section 72, for commanding transmission using a transmission button (not shown) contained in the operation section 72, the selection signal 16 containing the desired component selection information is sent out via the modulation circuit 76 and the antenna 78.

Although a mode in which the standard, kind (50Ω resistor) and size (1608) of a components are combined, is shown as an example of the component selection information described above, a mode in which all of the resistors having 50-ohms of resistance are selected without regard to component form such as chip component, discrete component, and the standard such as ½ W, ¼ W, is also possible.

A mode is also preferred in which a device such as EEPROM etc., which is rewritable on onboard, is used for the nonvolatile memory 74, so as to enable the component management information of the signal transmitter 14 to be rewritten. In addition, a mode is preferred which comprises a rewriting device having an external input/output terminal (connector) and an input/output interface, for use in rewriting data in the nonvolatile memory 74.

A one chip CPU and microprocessor (MPU), in which a peripheral device such as a memory (RAM, etc.) and a logic circuit are incorporated, may also be applied to the CPU 80.

Figure 5:
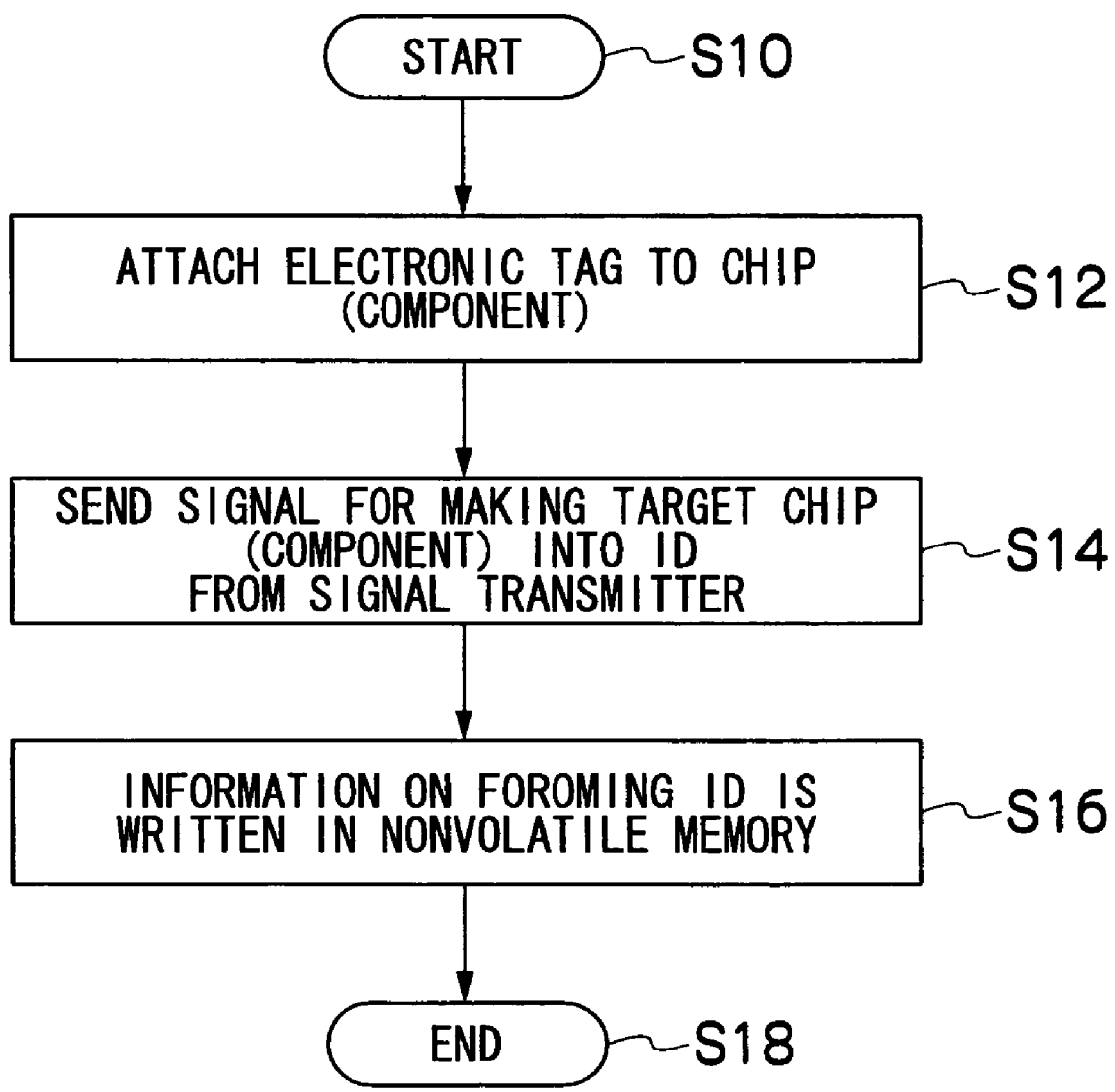
FIG. 5 is a flow chart showing a flow of a component management information writing control of the electronic tag shown in FIG. 3.
Figure 6:
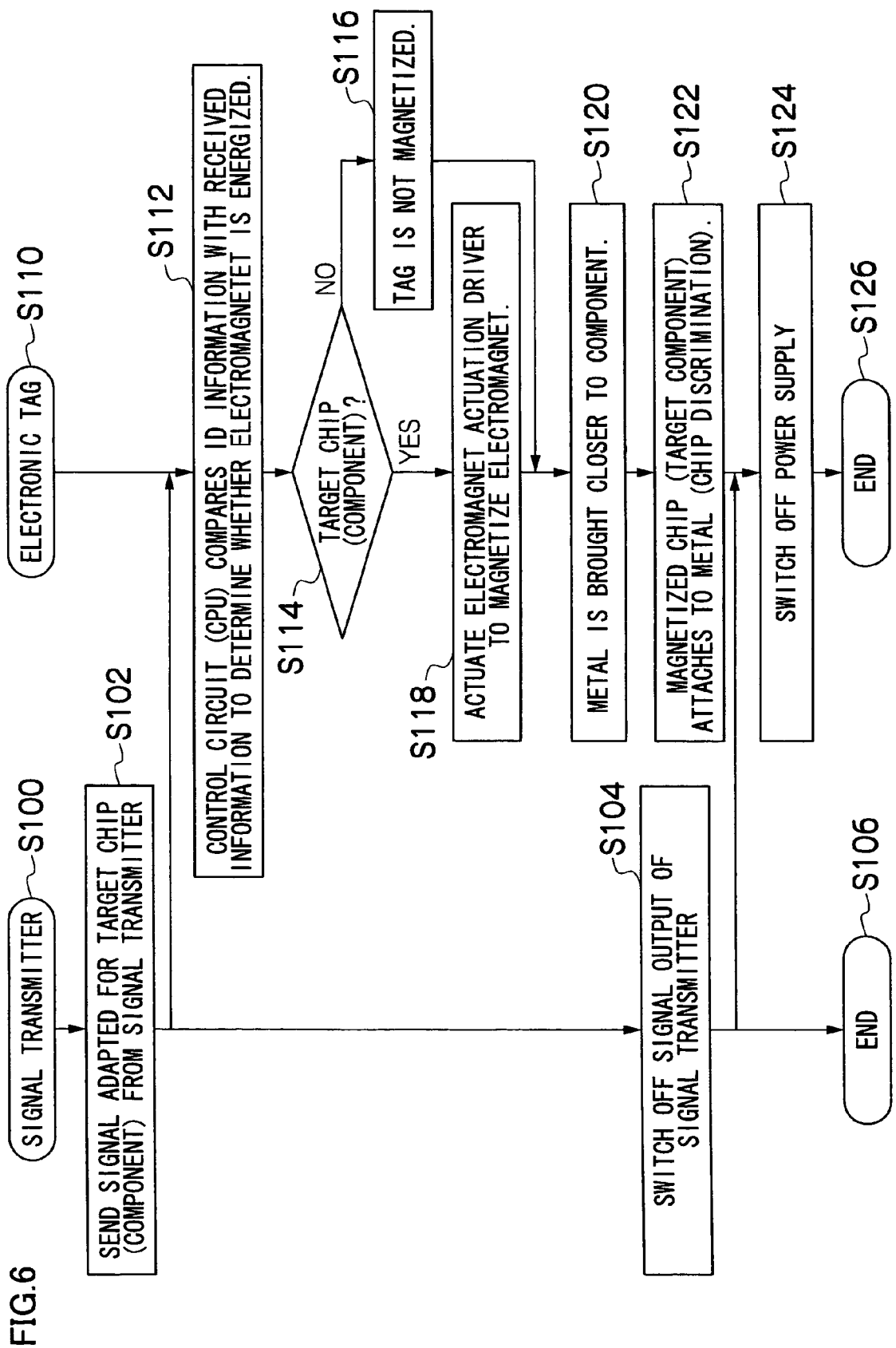
FIG. 6 is a flow chart showing a flow of control of the component management system according to an embodiment of the present invention.

Next, the control of the component management system is explained with reference to FIGS. 5 and 6. FIG. 5 is a flow chart showing a flow of control over ID formation in the initial state of an electronic tag 40, and FIG. 6 is the flow chart showing a flow of control for magnetizing a desired component.

When the control over ID formation for an electronic tag is initiated (step S10), the electronic tag is attached to each component (step S12).

Next, component management information for making a component into an ID is sent out to the target electronic tag from the signal transmitter 14 (step S14). When the electronic tag receives an electromagnetic wave serving as the component management information, the component management information is written in the nonvolatile memory 56 (step S16), and the control over ID formation is ended.

In a preferred mode, a verification step is provided for confirming that the component management information is written correctly, after the component management information is written.

On the other hand, when the component management information once written is rewritten, a deleting step for erasing the written component management information may be provided in the flow chart shown in FIG. 5, instead of the step (step S12) for attaching an electronic tag to a component.

Next, control for magnetizing a desired component by the selection signal 16 sent out from the signal transmitter 14 is explained with reference to FIG. 6.

When the power supply of the signal transmitter 14 is switched on to enable the signal transmitter 14 to be operable (step S100), the selection signal 16 adapted for the target component (for selecting a desired component) is sent out from the signal transmitter 14 (step S102).

On the other hand, in the electronic tag 40 made into an ID (step S110), when the selection signal 16 sent out from the signal transmitter 14 is received, the power is supplied to the interior of the electronic tag 40, and the electronic tag 40 is then made to start operating.

At this time, the component management information recorded in the nonvolatile memory 56 is compared (collated) with the component selection information contained in the selection signal 16, as a result of which the control circuit 58 determines whether the coil (electromagnet) 60 is to be magnetized (step S112).

That is, whether the component is the target chip (component) or not, is determined (step S114), and when the component is not the target chip (NO determination), the exciting current is not supplied to the coil 60, so that the electronic tag is not magnetized (step S116).

On the other hand, when the component is the target chip (YES determination), the electromagnet actuation driver 62 is driven to supply the exciting current to the coil 60, for magnetizing the electronic tag (step S118).

When the metal 18 is brought closer to the part case shown in FIG. 1 (step S120), while maintaining this state (namely, the state of continuously sending out the identification signal from the signal transmitter 14), the magnetized target electronic tag (component) attaches to the metal 18, as a result of which the desired component can be taken out by removing the desired component from the metal 18.

At this time, when the output of the selection signal 16 sent out from the signal transmitter 14 is switched off (step S104), the control at the side of the signal transmitter 14 is ended, and the power supply in the electronic tag 40 is cut off (step S124), so that the control of the electronic tag 40 is completed (step S126).

The flow of such control makes it possible to discriminate a target component from similar components which are not visually easily distinguished.

Next, a modification of the above described embodiments is explained with reference to FIGS. 7 to 9. In the figures of the modification, portions which are the same or similar to those in FIGS. 1 to 6, are denoted by the same reference numerals, and the explanation of the portions is omitted.

Figure 7:
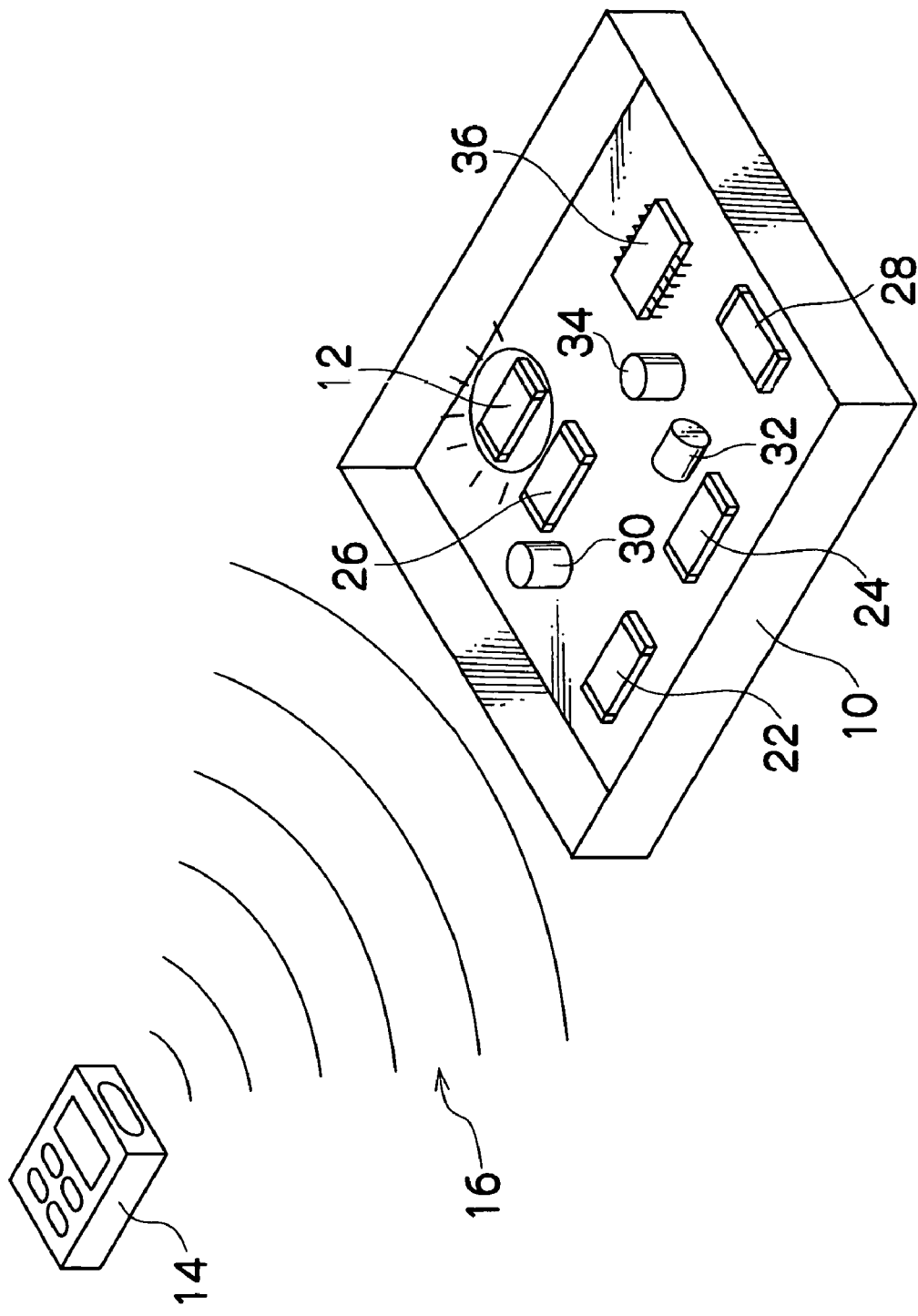
FIG. 7 is a block diagram of a component management system according to a modification of the embodiment.

FIG. 7 shows a state in which a light emitting body provided for an electronic tag 100 (not shown in FIG. 7) attached to a chip resistor (50Ω) 12 is made to emit light by the selection signal 16 sent out from the signal transmitter 14, so as to enable a desired component to be selected from components in the part case 10.

The component selection information for selecting the 50Ω chip resistor is contained in the selection signal 16, and among electronic tags which receive the selection signal, the electronic tag having the corresponding component management information (namely, electronic tag 100 attached to the chip resistor 12), is made to perform control for making the light emitting body provided for the electronic tag emit light.

As the method for attaching the electronic tag 100 to each component, the mounting method shown in FIGS. 2A to 2C may be applied.

In such component management system, it is possible to take out the target chip (component) easily from the part case 10 by taking out a component emitting light.

Figure 8:
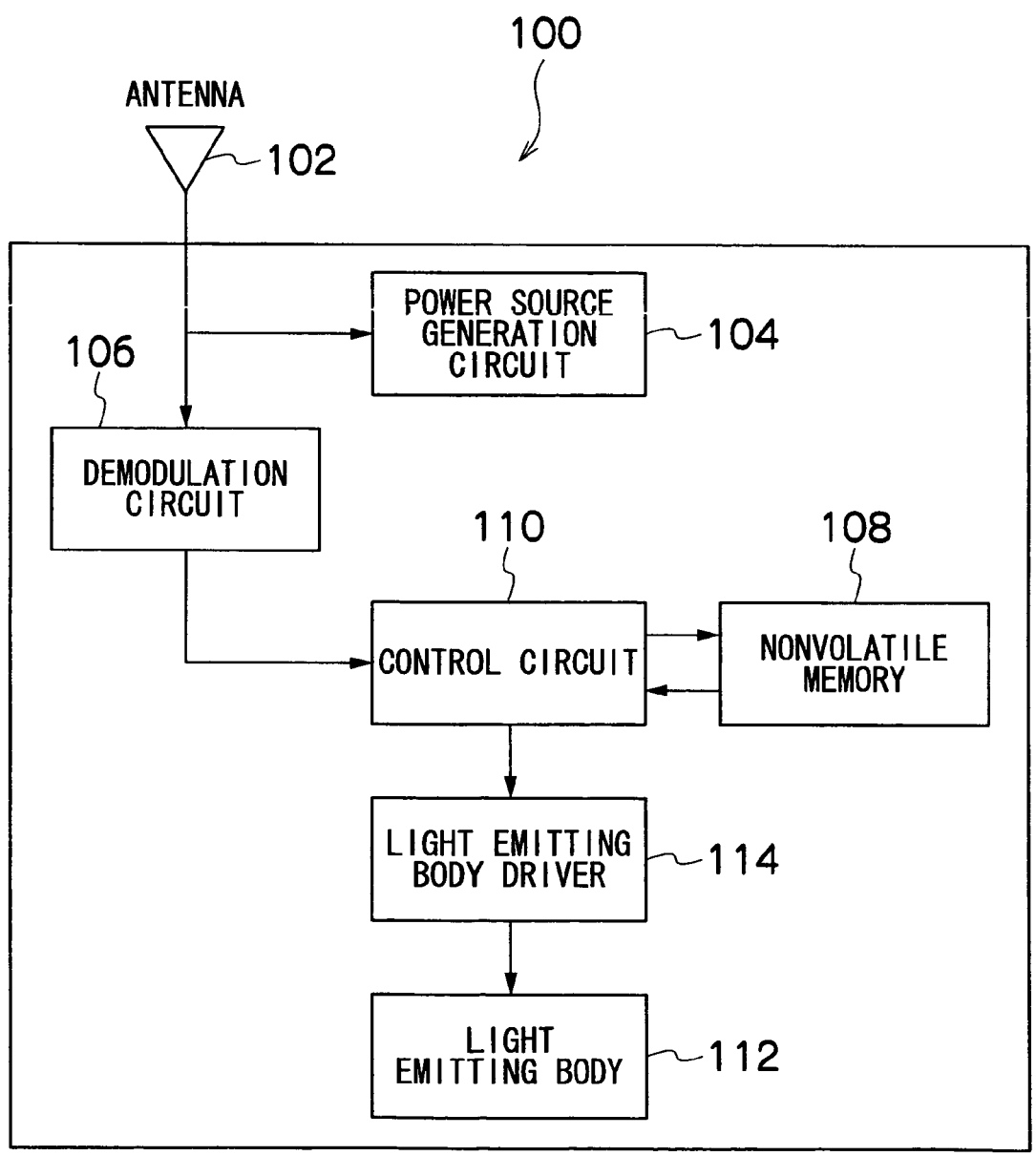
FIG. 8 is a block diagram showing an internal configuration of the electronic tag shown in FIG. 7.

FIG. 8 is a block diagram showing a configuration in the electronic tag 100, of which fundamental internal configuration is the same as that of the electronic tag 40 (42, 44) shown in FIG. 3, and which comprises: an antenna 102 which receives the selection signal 16; a power source generation circuit 104 activated by the selection signal 16 based on electromagnetic induction; a demodulation circuit 106 which converts the selection signal 16 (electromagnetic wave) into an electric signal; a nonvolatile memory 108 in which the component management information is recorded; and a control circuit 110 which performs control in the electronic tag 100.

The electronic tag 100 also comprises a light emitting body 112 and a light emitting body driver 114 for performing control to drive the light emitting body 112 (emit light) in accordance with a command from the control circuit 110, instead of the coil 60 and the electromagnet actuation driver 62 which are provided for the electronic tag 40.

A chip LED is applied to the light emitting body 112. The chip LED has luminescent colors of red, green, orange, and yellow, and any of the colors may be used. Of course, a color other than these colors may also be used. In the present example, although a chip LED is used for the light emitting body 112, other light emitting body may also be used.

Next, the control of the present modification is explained with reference to FIG. 9. The control of the present modification also consists of the component management information write control for the electronic tag 100, and the control for making the light emitting body of the electronic tag 100 attached to a desired component emit light, and the component management information write control for the electronic tag 100 can be performed in accordance with the procedure of the flow chart shown in FIG. 5.

On the other hand, FIG. 9 is a flow chart of the present modification showing the flow of the control for making a light emitting body of the electronic tag 100 attached to a desired component emit light.

In the flow chart shown in FIG. 9, a step for actuating the light emitting body driver to make the light emitting body emit light (step S200 in FIG. 9) is included instead of step S118 of the flow chart shown in FIG. 5, and a component discrimination step for taking out a component emitting light (step S202 in FIG. 9) is also included instead of steps S120 and S122 in FIG. 5.

The steps shown in FIG. 9 other than those described above are the same as those of the flow chart shown in FIG. 5, and their explanation is omitted here.

In the component management system configured as described above, when the selection signal 16 sent out from the signal transmitter 14 is received by an electronic tag attached to each component in the part case 10, the component management information recorded in the electronic tag is collated with the component selection information contained in the selection signal 16, so that when both pieces of the information coincide with each other, the coil 60 provided for the electronic tag is actuated. When the metal 18 is brought closer to components in the part case 10 while maintaining this state, a component provided with the electronic tag with the magnetized coil attaches to the metal 18, so that a desired component can be selectively taken out from the part case 10.

A light emitting body such as LED may be comprised instead of the coil 60, thereby enabling the light emitting body of an electronic tag attached to a desired component to emit light in accordance with the selection signal 16 sent out from the signal transmitter 14.

Although a coil (electromagnet) and a light emitting body (LED) are exemplified as the notifying device provided for the electronic tag in the present embodiments, a notifying device using a sound of a buzzer, etc. and a notifying device by means of heat may also be considered. In the case where the notifying device using sound is applied, a loudspeaker and a sound source may be provided, instead of the coil and the light emitting body and a driver which controls them (controlling device) may be provided. In the notifying device by means of heat, the Joule heat generated when a current is passed through a resistor may also be used.

Although a mode in which a desired component is selected from various kinds of electronic components is exemplified in the present embodiments, the present invention, of which scope is not limited to the electronic components, is also applicable to fastening parts such as a bolt and a screw, and to mechanical members constituting a mechanism (for example, supporting member, mechanism member, rotating member, etc.).

What is claimed is:

1. An electronic tag couplable to a component, comprising:
   a recording device which records component identification information of the component to which the electronic tag is coupled;
   a receiving device which receives a component selection signal containing component selection information sent out from a signal transmitter using an electromagnetic wave;
   a collating device which collates the component selection information contained in the component selection signal acquired by the receiving device with the component identification information recorded in the recording device; and
   a notifying device which notifies the result of collation performed by the collating device;
   wherein the notifying device comprises a magnetizing device, and wherein when the component selection information coincides with the component identification information as a result of collation performed by the collating device, the magnetizing device is magnetized.

2. The electronic tag according to claim 1, further comprising a component identification information writing device for writing the component identification information in the recording device, when receiving a write signal containing the component identification information of the component to which the electronic tag is coupled.

3. A component, comprising the electronic tag of claim 1.

4. A component, comprising the electronic tag of claim 2.

5. An electronic tag couplable to a component, comprising:
a recording device which records component identification information of the component to which the electronic tag is coupled;
a receiving device which receives a component selection signal containing component selection information sent out from a signal transmitter using an electromagnetic wave;
a collating device which collates the component selection information contained in the component selection signal acquired by the receiving device with the component identification information recorded in the recording device; and
a notifying device which notifies the result of collation performed by the collating device;
wherein the notifying device comprises a light emitting device, and wherein when the component selection information coincides with the component identification information as a result of collation performed by the collating device, the light emitting device is made to emit light.

6. The electronic tag according to claim 5, further comprising a component identification information writing device for writing the component identification information in the recording device, when receiving a write signal containing the component identification information of the component to which the electronic tag is coupled.

7. A component, comprising the electronic tag of claim 5.

8. A component, comprising the electronic tag of claim 6.

9. A component selection system comprising:
an electronic tag coupled to a component; and a signal transmitter for sending out an electromagnetic wave to the electronic tag,
wherein the signal transmitter comprises a signal transmission device which sends out a component selection signal containing component selection information for selecting a component to which the electronic tag is coupled,
and wherein the electronic tag comprises:
a receiving device which receives the component selection signal sent out from the signal transmitter;
a recording device which records component identification information of a component to which the electronic tag is coupled;
a collating device which collates the component selection information contained in a radio signal received by the receiving device with the component identification information recorded in the recording device; and
a notifying device which notifies the result of collation performed by the collating device; and
a component taking-out device which selectively takes out a desired component from a mixture of a number of components, based on the collation result from the notifying device.

10. The component selection system according to claim 9, wherein the signal transmitter comprises a component identification information storing device which stores the component identification information to be written in the electronic tag, and wherein the signal transmitter sends out to the electronic tag a write signal containing component identification information selected from the component identification information stored in the component identification information storing device.

11. The component selection system according to claim 10, wherein the component to which the electronic tag is coupled includes an electronic chip component.

12. The component selection system according to claim 10, wherein the electronic tag comprises a component identification information writing device which acquires the write signal sent out from the signal transmitter, and writes the component identification information contained in the write signal, in the recording device.

13. The component selection system according to claim 12, wherein the component to which the electronic tag is coupled includes an electronic chip component.

14. The component selection system according to claim 9, wherein the component to which the electronic tag is coupled includes an electronic chip component.

15. A component selection method of a component selection system comprising:
an electronic tag with a notifying device, coupled to a component;
a signal transmitter having a signal transmission device which sends out an electromagnetic wave to the electronic tag; and
a component taking-out device;
wherein when the signal transmission device provided for the signal transmitter sends out an electromagnetic wave containing component selection information for selecting a component to which the electronic tag is coupled;
the electronic tag receives the radio signal sent out from the signal transmitter, and collates the component selection information contained in the received radio signal with component identification information recorded in a recording device provided for the electronic tag, so as to notify the collation result via the notifying device; and
the component taking-out device selectively takes out a desired component from a mixture of a number of components, based on the collation result from the notifying device.

16. A method for extracting a component, comprising:
transmitting a component selection signal containing component selection information to a plurality of electronic tags coupled to a plurality of components, each electronic tag of said plurality of electronic tags being adapted to
receive said component selection signal,
make a determination whether said component selection information corresponds to component identification information, recorded in said electronic tag, which identifies a component to which said electronic tag is coupled, and
output said determination;
determining, based on said determination of an electronic tag, a desired component corresponding to said component selection information; and
extracting said desired component from said plurality of components.

17. The method of claim 16, wherein said outputting of said determination comprises emitting light through a light emitting device.

18. The method of claim 16, wherein said extracting comprises magnetically coupling to a desired electronic tag coupled to said desired component.

19. The method of claim 18, wherein said desired electronic tag comprises a magnetizing device, and is adapted to magnetize said magnetizing device to facilitate said extracting.

20. An apparatus for extracting a component, comprising:
a signal transmitter which transmits a component selection signal containing component selection information to a plurality of electronic tags coupled to a plurality of components, each electronic tag of said plurality of electronic tags being adapted to
receive said component selection signal,
make a determination whether said component selection information corresponds to component identification information, recorded in said electronic tag, which identifies a component to which said electronic tag is coupled, and
output said determination;
a processing device which determines, based on said determination of an electronic tag, a desired component corresponding to said component selection information; and
an extraction device which extracts said desired component from said plurality of components.

21. The apparatus of claim 20, wherein said extraction device is adapted to couple to said desired component using magnetic force.

22. The apparatus of claim 20, wherein said extraction device is adapted to couple to said desired component using mechanical force.

23. The method of claim 20, wherein said outputting of said determination comprises emitting light through a light emitting device.

24. The method of claim 20, wherein the electronic tag coupled to said desired component comprises a magnetizing device, and is adapted to magnetize said magnetizing device to facilitate said extracting.

* * * * *